United States Patent
Dubourdieu et al.

(10) Patent No.: US 8,785,995 B2
(45) Date of Patent: Jul. 22, 2014

(54) FERROELECTRIC SEMICONDUCTOR TRANSISTOR DEVICES HAVING GATE MODULATED CONDUCTIVE LAYER

(75) Inventors: Catherine A. Dubourdieu, New York, NY (US); David J. Frank, Yorktown Heights, NY (US); Martin M. Frank, Dobbs Ferry, NY (US); Vijay Narayanan, New York, NY (US); Paul M. Solomon, Yorktown Heights, NY (US); Thomas N. Theis, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 13/108,340

(22) Filed: May 16, 2011

(65) Prior Publication Data

US 2012/0292677 A1 Nov. 22, 2012

(51) Int. Cl.
*H01L 21/02* (2006.01)
*H01L 21/00* (2006.01)

(52) U.S. Cl.
USPC .................. 257/295; 257/E29.242; 438/3

(58) Field of Classification Search
None
See application file for complete search history.

(56) References Cited

U.S. PATENT DOCUMENTS

| | | | | |
|---|---|---|---|---|
| 6,018,171 A * | 1/2000 | Hsu et al. | ...................... | 257/295 |
| 6,831,313 B2 * | 12/2004 | Uchiyama et al. | ............. | 257/295 |
| 7,075,161 B2 * | 7/2006 | Barth | ............................. | 257/414 |
| 7,215,567 B2 * | 5/2007 | Hashimoto et al. | ........... | 365/145 |
| 7,329,548 B2 * | 2/2008 | Li et al. | ............................. | 438/3 |
| 8,324,699 B2 * | 12/2012 | Ichijo et al. | .................... | 257/431 |
| 8,426,728 B2 * | 4/2013 | Zhao et al. | ..................... | 136/264 |
| 2009/0127603 A1 * | 5/2009 | Yamakawa et al. | ........... | 257/295 |
| 2011/0101309 A1 * | 5/2011 | Lin et al. | ........................ | 257/29 |
| 2011/0170330 A1 * | 7/2011 | Oezyilmaz et al. | ........... | 365/145 |

FOREIGN PATENT DOCUMENTS

WO   WO 2009/054707 A2 *   4/2009   ............ H01L 27/105

OTHER PUBLICATIONS

L. Pintilie et al., "Metal-Ferroelectric-Metal Structures with Schottky Contacts. II. Analysis of the Experimental Current-Voltage and Capacitance-Voltage Characteristics of Pb(Zr, Ti) O3 Thin Films," Journal of Applied Physics, Dec. 2005, pp. 124104-1-124104-9, vol. 98, No. 12.
Y. Watanabe et al., "Theoretical Stability of Polarization in Metal/Ferroelectric/Insulator/Semiconductor and Related Structures," The Japanese Journal of Applied Physics, Sep. 2001, pp. 5610-5614, vol. 40, No. 9B.
T.J. Reece et al., "Nonvolatile Memory Element Based on a Ferroelectric Polymer Langmuir-Blodgett Film," Applied Physics Letters, Jan. 2003, pp. 142-144, vol. 82, No. 1.
Shu-Yau Wu, "A New Ferroelectric Memory Device, Metal-Ferroelectric-Semiconductor Transistor," IEEE Transactions on Electron Devices, Aug. 1974, pp. 499-504, vol. ED-21, No. 8. S. Salahuddin et al., "Use of Negative Capacitance to Provide Voltage Amplification for Low Power Nanoscale Devices," Nano Letters, Feb. 2008, pp. 405-410, vol. 8, No. 2.

* cited by examiner

*Primary Examiner* — Michael Jung
(74) *Attorney, Agent, or Firm* — Louis J Percello; Ryan, Mason & Lewis, LLP

(57) ABSTRACT

Ferroelectric semiconductor switching devices are provided, including field effect transistor (FET) devices having gate stack structures formed with a ferroelectric layer disposed between a gate contact and a thin conductive layer ("quantum conductive layer"). The gate contact and ferroelectric layer serve to modulate an effective work function of the thin conductive layer. The thin conductive layer with the modulated work function is coupled to a semiconductor channel layer to modulate current flow through the semiconductor and achieve a steep sub-threshold slope.

23 Claims, 5 Drawing Sheets

100

200

300

400

500

60

58.5nm PZT(50%), 1nm SiO2, $C_{dmp}$=10x 29.5nm PZT(50%), 1nm SiO2, $C_{dmp}$=20x

FERROELECTRIC SEMICONDUCTOR TRANSISTOR DEVICES HAVING GATE MODULATED CONDUCTIVE LAYER

TECHNICAL FIELD

This invention relates generally to semiconductor switching devices and, in particular to ferroelectric semiconductor field effect transistor (FET) devices having gate stack structures formed with a ferroelectric layer that couples a gate contact to a thin conductive layer to modulate an effective work function of the thin conductive layer and, in turn, modulate current flow through a semiconductor channel and achieve a steep sub-threshold slope.

BACKGROUND

One of the main barriers to achieving lower energy CMOS (complementary metal oxide semiconductor) logic is the difficulty in lowering the supply voltage. The supply voltage is constrained by the sub-threshold swing, which is limited by Fermi-Dirac statistics to 60 mV/decade at room temperature. In particular, it is known that with a conventional field effect transistor, a change in the channel potential of at least 60 mV at 300 K is needed to cause a change in the current by a factor of 10. This minimum sub-threshold slope results in a fundamental lower limit on the operating voltage for conventional FET semiconductor switches.

SUMMARY OF THE INVENTION

Exemplary embodiments of the invention generally include semiconductor switching devices and more specifically, field effect transistor (FET) devices having gate stack structures formed with a ferroelectric layer disposed between a gate contact and a thin conductive layer ("quantum conductive layer"). The gate contact and ferroelectric layer serve to modulate an effective work function of the thin conductive layer. The thin conductive layer with the modulated work function is coupled to a semiconductor channel layer to modulate current flow through the semiconductor and achieve a steep sub-threshold slope substantially lower than 60 mV/decade.

More specifically, in one exemplary embodiment, a semiconductor device includes a semiconductor substrate, a first source/drain contact and a second source/drain contact formed on the semiconductor substrate, and a gate structure formed on the semiconductor substrate between the first and second source/drain contacts. The gate structure includes a conductive layer disposed over the semiconductor substrate, a ferroelectric layer disposed over the conductive layer, and a gate contact layer disposed over the ferroelectric layer. The conductive layer of the gate structure is connected to the first source/drain contact. In another exemplary embodiment, the gate structure further includes an insulating layer between the conductive layer and the semiconductor substrate.

In other exemplary embodiments of the invention, the conductive layer may be a carbon nanostructure. The carbon nanostructure may include one or more carbon nanotubes. The conductive layer may be a thin continuous film of a metallic material or a conductive material having a thickness of about 3 nanometers or less, a carrier density of about $1\times10^{21}$ charges per cubic centimeter, and/or an internal dielectric constant of about 30 or greater. For example, the conductive layer may be a thin continuous film of a metal or metallic material or a conductive material such as doped Strontium Titanate $SrTiO_3$ (STO), or compositions of TaN or TaSiN, or transparent conducting oxides such as ZnO, which may be combined with a higher k material to increase the dielectric constant of the transparent conducting oxide.

In yet another exemplary embodiment, a semiconductor device includes a semiconductor substrate, a conductive layer disposed over the semiconductor substrate, a ferroelectric layer disposed over the conductive layer, and a contact layer disposed over the ferroelectric layer. The conductive layer is formed of a conductive material having a carrier density of about $1\times10^{21}$ charges per cubic centimeter, having a thickness of about three nanometers or less, and having an internal dielectric constant of about 30 or greater. The ferroelectric layer has an effective negative capacitance approximately equal and opposite a capacitance provided by the conductive layer.

In still another exemplary embodiment, a semiconductor device includes a semiconductor substrate, a first source/drain contact and a second source/drain contact formed on the semiconductor substrate, a control voltage contact, and a gate structure formed on the semiconductor substrate. The gate structure includes a conductive layer disposed over the semiconductor substrate, a ferroelectric layer disposed over the conductive layer, and a gate contact layer disposed over the ferroelectric layer. The conductive layer of the gate structure is connected to the control voltage contact.

These and other exemplary embodiments, features and advantages of the present invention will become apparent from the following detailed description of preferred embodiments, which is to be read in conjunction with the accompanying figures.

DETAILED DESCRIPTION OF EXEMPLARY EMBODIMENTS

Figure 1:
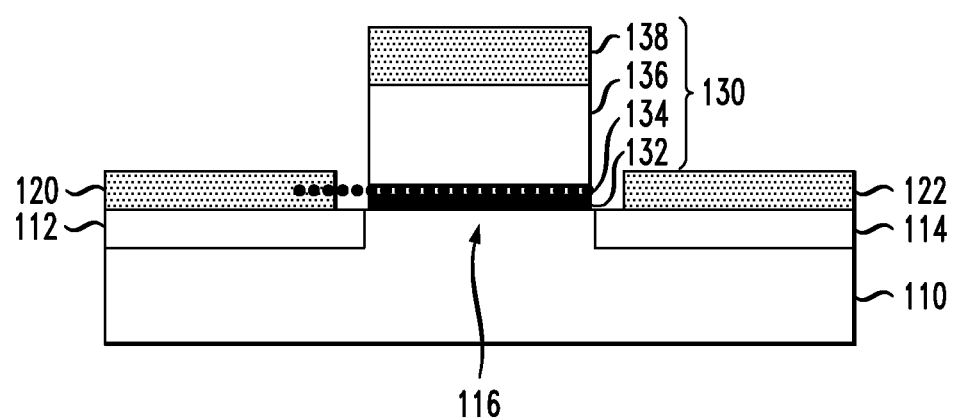
FIG. 1 is a cross-sectional view of a ferroelectric semiconductor switching device, according to an exemplary embodiment of the invention.

Exemplary embodiments of the invention will now be described in further detail with reference to ferroelectric semiconductor switching devices and, more specifically, field effect transistor (FET) devices having gate stack structures formed with a ferroelectric layer disposed between a gate contact and a thin conductive or metal layer (referred to herein as "quantum conductive layer"). The gate contact and ferroelectric layer serve to modulate an effective work function of the quantum conductive layer. The quantum conductive layer with the modulated work function is coupled to a semiconductor channel layer to modulate current flow through the semiconductor and achieve a steep sub-threshold slope.

Recently, it was suggested that gate dielectrics containing a ferroelectric (FE) layer could enable the fabrication of MOSFETs with steep sub-threshold slope, exceeding the conventional limit of 60 mV/decade. See Salahuddin, et al., "*Use of Negative Capacitance to Provide Voltage Amplification for Low Power Nanoscale Devices*," Nano Letters, Vol. 8, No. 2, 2008, pages 405-410. Salahuddin, et al. suggests that by replacing a standard gate insulator layer with a ferroelectric insulator layer of a proper thickness, it would be possible to implement a voltage transformer internal to the device that will amplify the gate voltage and, thus, lead to sub-threshold slope values that are lower than 60 mV/decade, thereby enabling low voltage/low power operation. The voltage transformer concept can be understood intuitively as the result of an effective negative capacitance provided by the ferroelectric capacitor, which arises from an internal positive feedback.

However, the benefit of using an ferroelectric layer in the gate stack of an FET (as proposed by Salahuddin, et al.) is limited, because there does not appear to be any ferroelectric and/or geometric arrangement that will provide a steep sub-threshold slope over a large range of semiconductor surface potential. In particular, to achieve a steep sub-threshold slope over a large range of semiconductor surface potential, a relatively constant positive capacitance is needed to balance the negative capacitance provided by the ferroelectric layer in the gate stack. However, the nonlinear charge-voltage characteristics of semiconductor inversion layers are not matched to known ferroelectric characteristics, making it very unlikely that the desired behavior can be obtained in the manner proposed by Salahuddin, et al. In other words, while a semiconductor layer (channel layer) provides a positive capacitance to counteract the negative capacitance of a ferroelectric layer, this positive capacitance provided by the semiconductor layer varies substantially over a wide range of gate voltage, making is difficult to achieve a steep sub-threshold slope over a wide range of gate voltage simply by use of a ferroelectric layer, as proposed by Salahuddin, et al.

As discussed in further detail below, we have determined that if properly designed, a ferroelectric insulator layer within a gate stack of an FET may effectively contribute negative capacitance to the dielectric stack, increasing its overall capacitance, without causing hysteresis. Moreover, the negative capacitance of the ferroelectric layer can be effectively balanced against a constant positive capacitance provided by the quantum capacitance of a thin conductive layer interposed between the ferroelectric layer and semiconductor layer. The use of a thin conductive layer and the ferroelectric layer in the gate stack results in an inversion charge density (and thus, drain current) that rises sharply with small changes in gate voltage, and allows for a steep sub-threshold slope over a wide range of gate voltage. It is important to note that such a design is not trivial in that, e.g., the negative capacitance region of the ferroelectric layer is not generally accessible experimentally and that this theory requires precise balance, in terms of the type of material and thickness of the ferroelectric layer, the polarization and non-linearity of the ferroelectric layer and the quantum capacitance of the conductive layer to achieve a steep sub-threshold slope using the negative capacitance state.

In general, FIGS. 1, 2, 3, 4, and 5 are cross-sectional views of ferroelectric semiconductor switching devices according to various exemplary embodiments of the invention, which improve upon proposed ferroelectric semiconductor switching device structures. The exemplary embodiments of ferroelectric semiconductor switching devices as shown in FIGS. 1-5 rectify several primary problems associated with coupling ferroelectrics to semiconductors, which arise from the fact that (a) ferroelectrics need fairly constant positive capacitances against which to apply their negative capacitance, and (b) ferroelectrics need to switch a lot more charge than the charge that the semiconductor needs to switch. Both of these problematic issues are addressed by use of a quantum conductive layer (which can be a very thin metal layer (or metal-like) layer or thin conductive layer) in a gate stack between a ferroelectric layer and the semiconductor channel layer, as will be discussed in further detail with reference to the exemplary structures of FIGS. 1-5.

For example, the inclusion of a quantum conductive layer in a gate stack between a ferroelectric layer and the semiconductor channel layer serves to present a nearly constant quantum capacitance to the ferroelectric layer, so that the negative capacitance of the ferroelectric can operate against this nearly constant quantum capacitance over a wide range of charge, eliminating the first problem. Moreover, the thickness of the quantum conductive layer is optimized to be thin enough and have a low enough carrier density such that the work function of the quantum conductive layer is significantly modulated by the ferroelectric switching. This modulated work function of the quantum conductive layer couples to the semiconductor channel layer, thereby modulating the current flow. Thus, the quantum conductive layer, in effect, attenuates larger charge swings of the ferroelectric layer yielding smaller, more suitable charge swings in the semiconductor, and thus eliminating the second problem.

Figure 2:
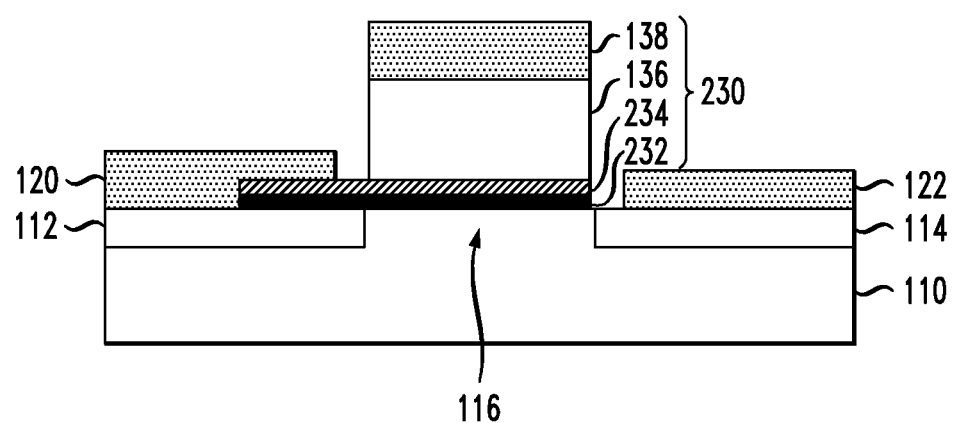
FIG. 2 is a cross-sectional view of a ferroelectric semiconductor switching device, according to another exemplary embodiment of the invention.

As discussed in further detail below with reference to FIGS. 1, 2, 3, 4, and 5 several approaches are provided for modulating current flow in ferroelectric semiconductor switching devices according to exemplary embodiments of the invention. In some exemplary embodiments as depicted in FIGS. 1, 2 and 5, a thin gate dielectric (or insulator layer) is disposed between a quantum conductive layer and a semiconductor channel layer such that current would flow in the semiconductor inversion layer between drain and source regions, with the thin quantum conductive layer with modulated work function serving as the gate for the semiconductor. In these exemplary embodiments, carriers do not flow directly into the semiconductor layer from the thin quantum conductive layer. Rather, modulating the work function of the quantum metal layer serves to shift the threshold voltage of the semiconductor device to achieve a steep sub-threshold slope.

Figure 3:
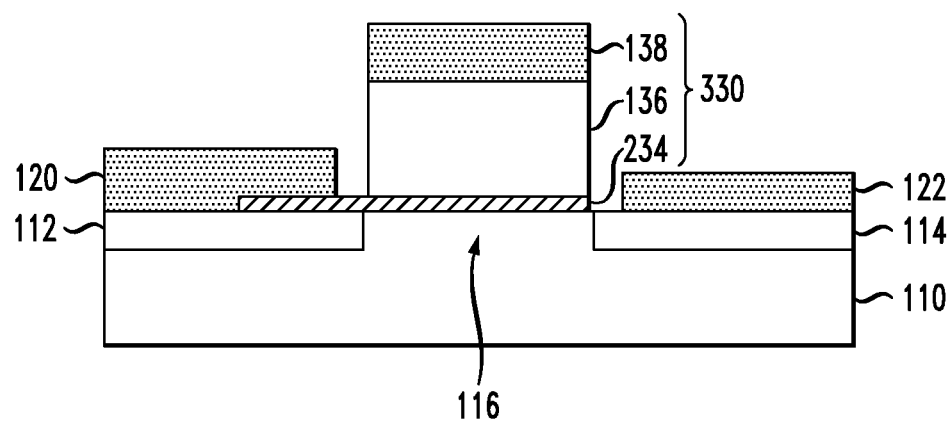
FIG. 3 is a cross-sectional view of a ferroelectric semiconductor switching device, according to another exemplary embodiment of the invention.
Figure 4:
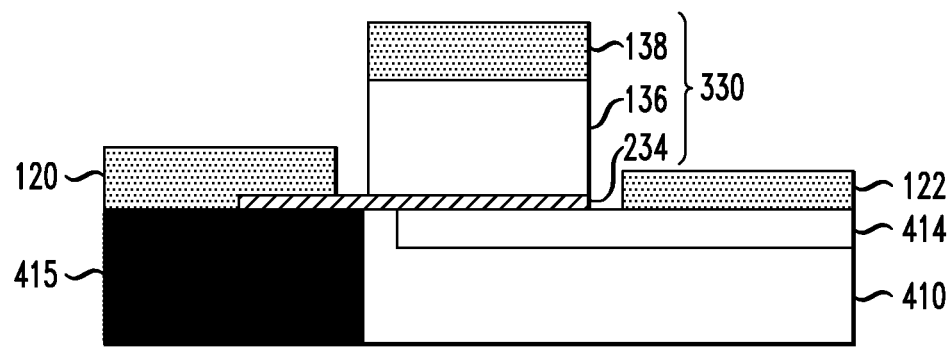
FIG. 4 is a cross-sectional view of a ferroelectric semiconductor switching device, according to another exemplary embodiment of the invention.
Figure 5:
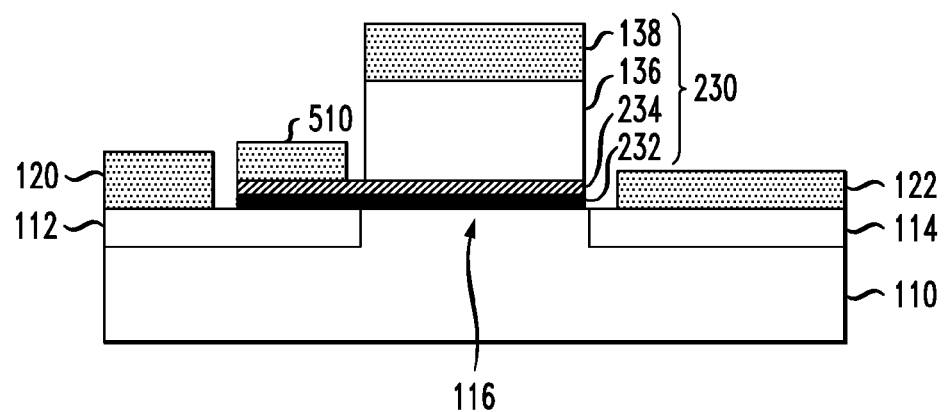
FIG. 5 is a cross-sectional view of a ferroelectric semiconductor switching device, according to another exemplary embodiment of the invention.

In other exemplary embodiments of the invention as depicted in FIGS. 3 and 4, there is no thin gate dielectric (or insulator layer) disposed between a quantum conductive layer and a semiconductor channel layer. Instead, the quantum conductive layer is formed in contact with the semiconductor channel layer such that current could flow from the quantum conductive layer into the semiconductor inversion layer between drain and source regions. With these exemplary embodiments, the gate modulates the barrier between the thin quantum conductive layer and the semiconductor layer in such a way that electrons can flow directly from the thin quantum conductive layer into the semiconductor channel layer depending on the gate voltage. By way of specific example, current would flow from the thin quantum conductive layer into the semiconductor layer as in a Schottky barrier diode, with the barrier height being modulated by the ferroelectric gate contact.

In all exemplary embodiments of the invention as depicted in FIGS. 1-5, a general operating principle is that a ferroelectric gate structure modulates a work function of the thin quantum conductive layer. The modulated work function of the thin quantum conductive layer modulates the semiconductor layer in a way to achieve a steep sub-threshold regime and provide a semiconductor switching device that can operate at low voltage. Depending on the gate structure, modulating the work function of the thin quantum conductive layer serves to modulate the threshold voltage of the switching device and/or the amount of current that flows from the quantum conductive layer directly into the semiconductor channel layer of the switching device. Exemplary embodiments of these ferroelectric switching devices will now be discussed in further detail with regard to FIGS. 1-5.

FIG. 1 is a cross-sectional view of a ferroelectric semiconductor switching device, according to an exemplary embodiment of the invention. In particular, FIG. 1 shows a field effect transistor 100 comprising a substrate 110, a first source/drain contact 120, a second source/drain contact 122, and a gate structure 130. The substrate 110 includes a first doped region 112 below the first source/drain contact 120, a second doped region 114 below the second source/drain contact 122, and a channel region 116 (or inversion region) below the gate structure 130. The substrate 110 may be formed of silicon (Si), or other known semiconductor materials. The substrate 110 may have a SOI (silicon on insulator) type structure, or other known structures. Depending on the structure of the substrate 110, the channel region 116 may or may not be doped with doping type that is opposite to the doping type of the source/drain doped regions 112 and 114, as is well understood by those of ordinary skill in the art. In one exemplary embodiment, the first source/drain contact 120 may be a source contact and the second source/drain contact 122 may be drain contact, or in an alternative embodiment, the first source/drain contact 120 may be a drain contact and the second source/drain contact 122 may be a source contact. In this regard, the term "source/drain contact" as used herein refers to the fact that the first and second source/drain contacts 120 and 122 may be source or drain electrodes.

The gate structure 130 is a stack structure comprising a gate dielectric layer 132, a quantum conductive layer 134, a ferroelectric layer 136 and a gate contact 138. The gate dielectric layer 132 may be formed of a thin insulator layer of silicon dioxide ($SiO_2$) or other suitable gate dielectric or insulating materials. The ferroelectric layer 136 may be formed of a suitable ferroelectric material such as a perovskite-type oxide, e.g., $PbZr_xTi_{1-x}O_3$ (PZT) (Lead Zirconate Titanate), BST (Barium Strontium Titanate), Barium Titanate (Ba-$TiO_3$), $SrBi_2Ta_2O_9$, or Bismuth Iron Oxide ($BiFeO_3$), or hexagonal REMnO3 compounds with RE being a rare-earth, e.g., Yttrium Manganese Oxide (YMnO3), or a ferroelectric polymer or organic material.

In the exemplary embodiment of FIG. 1, the thin quantum conductive layer 134 comprises a carbon nanostructure such as a mesh or grid of metallic carbon nanotubes, connected at one end to the first source/drain contact 120. In another exemplary embodiment, the thin quantum conductive layer 134 may comprise a graphene layer.

In the device geometry of FIG. 1, the gate contact 138 and ferroelectric layer 136 modulate the work function of the carbon nanostructure 134, which in turn modulates the threshold voltage of the FET device 100, which in turn modulates the current flow from the first source/drain 120 to the second source/drain contact 122 through the channel region 116. In this exemplary embodiment, by making the carbon nanostructure 134 thin enough, the quantum mechanics of the layer 134 will be such that gate 138 and ferroelectric layer 136 will modulate the work function of the quantum conductive layer 134 in such a way that the threshold voltage of the FET device 100 varies from the positive to negative regime to thereby achieve a steep sub-threshold slope. In this instance, the modulated current flow would be in the semiconductor inversion layer 116, with the work function modulated quantum conductive layer 132 serving as the gate for the semiconductor device.

FIG. 2 is a cross-sectional view of a ferroelectric semiconductor switching device according to another exemplary embodiment of the invention. In particular, FIG. 2 shows a field effect transistor 200 which is similar to the field effect transistor 100 of FIG. 1, except that a gate structure 230 includes a quantum conductive layer 234 formed by a thin continuous metal or conductive film (as opposed to a carbon nanostructure as in FIG. 1). In an exemplary embodiment, the quantum conductive layer 234 is formed of a metallic or conductive material having a low density of states (DOS), e.g., a concentration of electrons (carrier density) less than about $1 \times 10^{22}$ charges per cubic centimeter, or more preferably, about $1 \times 10^{21}$ charges per cubic centimeter. For example, in one exemplary embodiment, the quantum conductive layer 234 may be formed of a doped Strontium Titanate ($SrTiO_3$) film (alternatively referred to herein as a doped "STO" film) connected at one side to the first source/drain contact 120. The doped STO film may be STO doped with metal material such as Nb or La, or other suitable metallic material. In other embodiments, doping of STO can be achieved by substituting elements and/or by oxygen vacancies, as is known in the art.

In other exemplary embodiments, other thin conductive or metal films may be used to form the thin quantum conductive layer 234, which preferably have a thickness of less than about 3 nanometers, a carrier density of about $1 \times 10^{21}$ charges per cubic centimeter, and an internal dielectric constant of about 30 or greater. Examples of such metal films include appropriate compositions of TaN or TaSiN, or transparent conducting oxides such as ZnO, which may be combined with a higher k material to increase the dielectric constant of the transparent conducting oxide.

In the device geometry of FIG. 2, similar to the operational mode of the FET 100 of FIG. 1, the gate contact 138 and ferroelectric layer 136 modulate the work function of the thin quantum conductive layer 234, which in turn modulates the threshold voltage of the FET device 200, which in turn modulates the current flow from the first source/drain 120 to the second source/drain contact 122 through the channel region 116. In this exemplary embodiment, by making the quantum conductive layer 234 thin enough, the quantum mechanics of the layer 234 will be such that gate 138 and ferroelectric layer 136 will modulate the work function of the quantum conductive layer 234 in such a way that the threshold voltage of the FET device 200 varies from the positive to negative regime, to thereby achieve a steep sub-threshold slope.

FIG. 3 is a cross-sectional view of a ferroelectric semiconductor switching device, according to another exemplary embodiment of the invention. In particular, FIG. 3 shows a field effect transistor 300 which is similar to the field effect transistor 200 of FIG. 2, except that a gate structure 330 includes a quantum conductive layer 234 formed directly on the silicon substrate 110. The ferroelectric layer 136 and thin quantum conductive layer 234 in FIG. 3 may be formed of the same materials as discussed above with reference to the exemplary structures of FIGS. 1 and 2. In the exemplary embodiment of FIG. 3, the gate contact 138 and ferroelectric layer 136 modulate the work function of the quantum metal layer 234, which is in Schottky contact with the silicon substrate 110, in particular, the semiconductor channel region 116.

In the device geometry of FIG. 3, the gate contact 138 and ferroelectric layer 136 modulate the work function of the thin quantum conductive layer 234, which in turn modulates the threshold voltage of the FET device 300. In particular, modulating the work function of the quantum metal layer 234 directly shifts the surface potential of the silicon, thereby modulating the current flow from the first source/drain contact 120 to the second source/drain contact 122 through the channel region 116 of the silicon substrate 110. Moreover, modulating the work function of the quantum conductive layer 234 in effect modulates the connection of the quantum conductive layer 234 to the silicon substrate 110, so that an ohmic contact exists between the quantum conductive layer 234 and the silicon 110. This allows current to flow directly from the quantum conductive layer 234 into the silicon layer 110 and then to the second source/drain contact 122. In other words, in the device structure of FIG. 3, the gate contact 138 and ferroelectric layer 136 modulate the barrier between the quantum conductive layer 234 and semiconductor substrate 110 in such a way that electrons flow directly from the quantum conductive layer 234 into the channel region 116 depending on the gate voltage. In this regard, current can flow in the semiconductor channel layer 116 from the first doped region 112 to the second doped region 114 and from the thin quantum conductive layer 234 into the channel layer 116.

FIG. 4 is a cross-sectional view of a ferroelectric semiconductor switching device according to another exemplary embodiment of the invention. In particular, FIG. 4 shows a ferroelectric semiconductor switching device 400 which is similar to the ferroelectric semiconductor switching device 300 of FIG. 3, except that a substrate includes a silicon layer 410 and an insulating layer 415. The gate structure 330 and second source/drain contact 122 are formed over the silicon layer 410 and the first source/drain contact 120 is formed on the insulating layer 415. In addition, a doped region 414 is formed in the silicon layer 410 below the gate structure 330 and the second source/drain contact 122.

In the device geometry of FIG. 4, the gate contact 138 and ferroelectric layer 136 modulate the work function of the thin quantum conductive layer 234, which in effect modulates the connection of the quantum conductive layer 234 to the silicon layer 410, so that an ohmic contact exists between the quantum conductive layer 234 and the silicon layer 410. This allows current to flow directly from the first source/drain contact 120 through the quantum conductive layer 234 into the silicon layer 410 and then to the second source/drain contact 122. In other words, in the device structure of FIG. 4, the gate contact 138 and ferroelectric layer 136 modulate the work function of the thin quantum conductive layer 234, which forms a Schottky contact with the silicon layer 410, thus modulating the Schottky barrier height. When the barrier is low enough or negative, current flows through the interface from the quantum conductive layer 234 into the silicon layer 410, and then into the second source/drain contact 122. However, because the first source/drain contact 120 is formed on the insulating layer 415, no current flows from the first source/drain contact 120 directly to the second source/drain contact 122 though the silicon layer 410.

FIG. 5 is a cross-sectional view of a ferroelectric semiconductor switching device, according to another exemplary embodiment of the invention. In particular, FIG. 5 shows a field effect transistor 500 which is similar to the field effect transistor 200 of FIG. 2, except that the thin quantum conductive layer 234 is connected to a separate contact 510 (or control voltage contact), instead of the first source/drain contact 120. With this exemplary embodiment, the thin quantum conductive layer 234 connects to the separate contact 510, which can have a separate control voltage applied thereto to shift the threshold voltage of the FET structure. Indeed, by applying a separate control voltage to the contact 510, a steep turn-on characteristic may be achieved for a different gate voltage, away from zero. This operational mode may be useful for circuits that must accept input signals from conventional higher voltage logic, for example.

Figure 6:
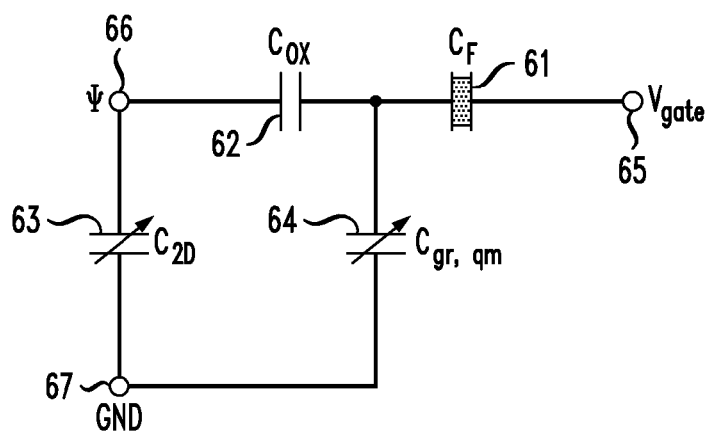
FIG. 6 is a schematic circuit diagram of a charge model used to simulate operational characteristics of a ferroelectric semiconductor switching device according to an exemplary embodiment of the invention.

In general, an operating principle of the ferroelectric semiconductor switching devices of FIGS. 1-5 is that gate contact 138 and ferroelectric layer 136 modulate the thin quantum conductive layer, which in turn modulates the semiconductor layer to achieve a steep sub-threshold slope of about 50 mV/decade or less, and allow operation at low voltage. Various computer simulations were performed to determine operational characteristics of ferroelectric semiconductor switching devices according to exemplary embodiments of the invention. FIG. 6 is a schematic circuit diagram of a charge model that was used to simulate operational characteristics of a ferroelectric semiconductor switching device.

In particular, FIG. 6 is a schematic circuit diagram of a charge model used for simulating operation characteristics of a ferroelectric semiconductor switching device having a framework based on the structures of FIGS. 1 and 2, wherein a thin insulating layer is interposed between the thin quantum conductive layer and the silicon layer. The charge model applies to the limit where the quantum conductive layer is thin enough such that screening effects within the quantum conductive layer are negligible. FIG. 6 depicts circuit 60 comprising a plurality of capacitors $C_F$ 61, $C_{OX}$ 62, $C_{2D}$ 63, and $C_{gr,qm}$ 64, and a plurality of nodes Vgate 65, $\Psi$ 66, and Gnd 67. The capacitor $C_F$ 61 represents a capacitance of a ferroelectric layer. The capacitor $C_{OX}$ 62 represents a capacitance of the thin gate insulating layer. The capacitor $C_{2D}$ 63 represents a capacitance of the inversion (channel) layer as charge is pulled to the surface of the silicon layer. The capacitor $C_{gr,qm}$ 64 represents a capacitance of a thin quantum metal layer. In this charge model diagram 60, gate voltage is applied to node Vgate 65, ground voltage is applied at node Gnd 67, and simulation equations are solved for a surface potential at node $\Psi$ 66, which represents the surface potential of a silicon layer.

Computer simulations were performed using the effective circuit 60 of FIG. 6 based on the charge-voltage characteristics of silicon (assuming a silicon substrate) and assuming a ferroelectric layer formed of PZT (specifically, $PbZr_{0.5}Ti_{0.5}O_3$), and a gate insulating layer formed of silicon dioxide. Moreover, the value of the capacitor $C_{gr,qm}$ 64 was selected to be a multiple of the capacitance of the gate insulating layer. In actual device implementation, the ratio of the capacitance of the quantum conductive layer to the capacitance of the gate insulating layer would be achieved based on the thickness of the quantum conductive layer and the type(s)

of materials used to form the quantum conductive layer. For the computer simulations, the value of $C_{gr,qm}$ 64 was selected to be a simple multiple of $C_{OX}$ 62.

Figure 7:
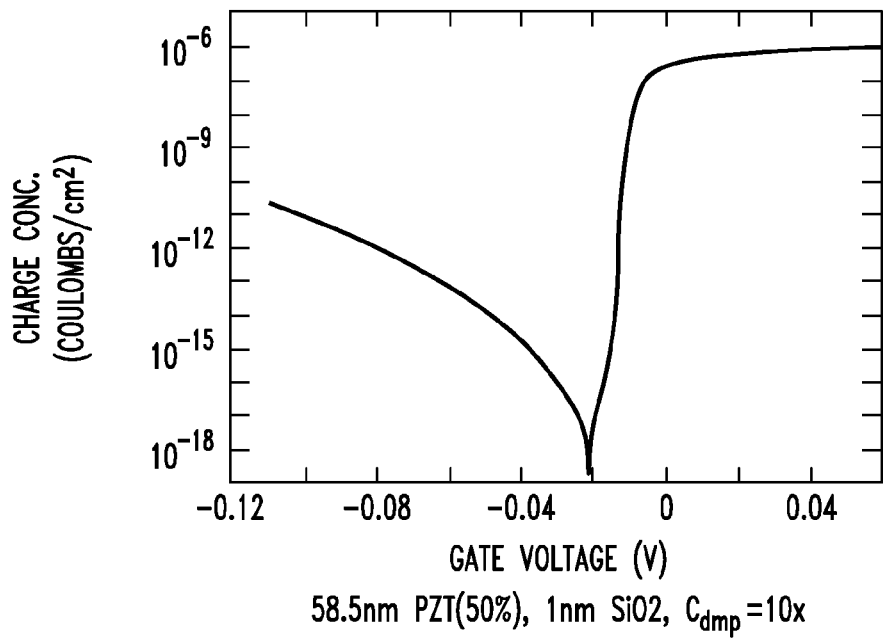
FIG. 7 is a simulated CV (charge vs. voltage) curve illustrating charge concentration in a silicon channel versus gate voltage for a ferroelectric semiconductor switching device modeled using the circuit diagram of FIG. 6, according to an exemplary embodiment of the invention.
Figure 8:
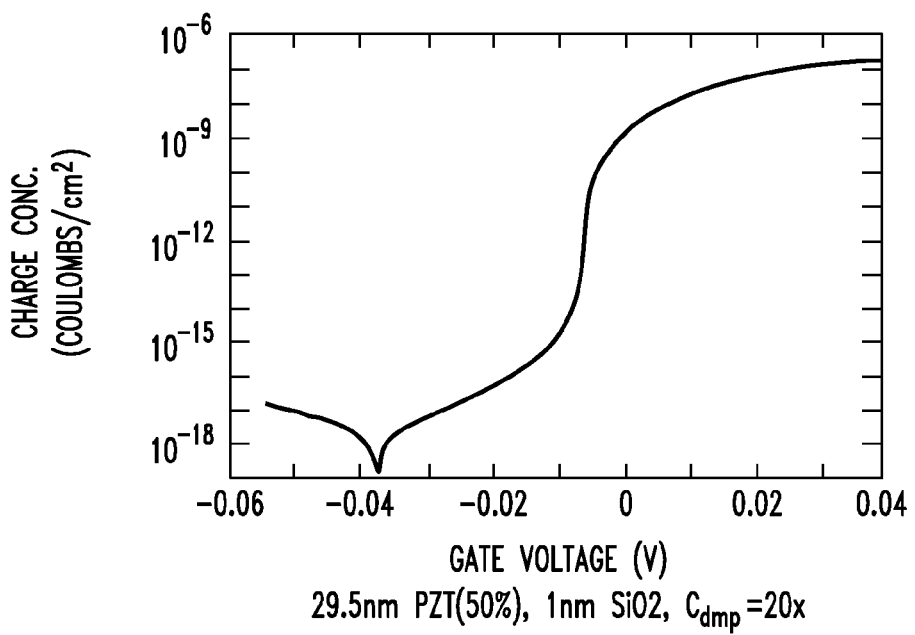
FIG. 8 is a simulated CV (charge vs. voltage) curve illustrating charge concentration in a silicon channel versus gate voltage for a ferroelectric semiconductor switching device modeled using the circuit diagram of FIG. 6, according to another exemplary embodiment of the invention.
Figure 9:
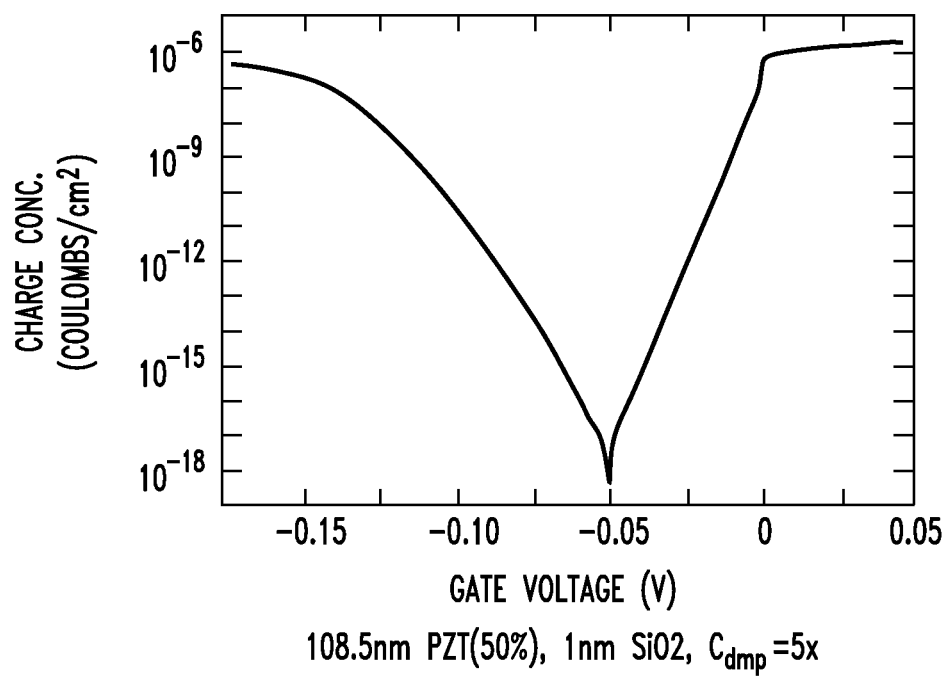
FIG. 9 is a simulated CV (charge vs. voltage) curve illustrating charge concentration in a silicon channel versus gate voltage for a ferroelectric semiconductor switching device modeled using the circuit diagram of FIG. 6, according to another exemplary embodiment of the invention.

FIGS. 7, 8, and 9 are simulated CV (charge vs. voltage) curves illustrating charge concentration in a silicon channel versus gate voltage for a ferroelectric semiconductor switching device modeled using the circuit diagram of FIG. 6, wherein parameters were varied for the thickness of a PZT ferroelectric layer, a silicon oxide gate insulating layer, and a ratio $C_{dmp}$ of a capacitance of the quantum conductive layer to the capacitance of the gate insulating layer. In particular, FIG. 7 is a simulated CV curve illustrating charge concentration in a silicon channel versus gate voltage for a ferroelectric semiconductor switching device modeled using the circuit diagram of FIG. 6, wherein thickness of the PZT layer was set at 58.5 nm, wherein the thickness of the silicon oxide layer was set at 1 nm, and where the ratio $C_{dmp}$ of a capacitance of the quantum conductive layer to the capacitance of the gate insulating layer was set at 10 (i.e., the capacitance of the quantum conductive layer is 10 times greater than the capacitance of the oxide layer). FIG. 8 is a simulated CV curve illustrating charge concentration in a silicon channel versus gate voltage for a ferroelectric semiconductor switching device modeled using the circuit diagram of FIG. 6, wherein thickness of the PZT layer was set at 29.5 nm, wherein the thickness of the silicon oxide layer was set at 1 nm, and where the ratio $C_{dmp}$ of a capacitance of the quantum conductive layer to the capacitance of the gate insulating layer was set at 20. FIG. 9 is a simulated CV curve illustrating charge concentration in a silicon channel versus gate voltage for a ferroelectric semiconductor switching device modeled using the circuit diagram of FIG. 6, wherein thickness of the PZT layer was set at 108.5 nm, wherein the thickness of the silicon oxide layer was set at 1 nm, and wherein the ratio $C_{dmp}$ of a capacitance of the quantum conductive layer to the capacitance of the gate insulating layer was set at 5.

In each of FIGS. 7, 8 and 9, the y-axis represents a charge concentration (in coulombs per $cm^2$) in the silicon layer and the x-axis represent applied gate voltage. As can be gleaned from the simulation results of FIGS. 7, 8 and 9, the average sub-threshold slope for a semiconductor switching device having a framework described herein can be in a range of about 2-4 mV/decade range over a very wide range (12 orders of magnitude, neglecting other sources of leakage).

Based on computer simulations performed such as those discussed above, we submit that the quantum behavior of the conductive layer will optimally be achieved for a conductive material or metal with high permittivity and moderate effective mass (0.3 to 0.5). Moreover, a sheet charge density of approximately 30 µC/$cm^2$ or more would be desirable to match the properties of the ferroelectric material layer, yielding a sheet electron concentration of approximately $2\times10^{14}$ per $cm^2$. For a conductive layer (such as a metal) two nm in thickness, this would mean that the 3D electron density should probably be around $1\times10^{21}$ per cubic cm. Moreover, we submit that doped STO ($SrTiO_3$) and similar material are good materials to achieve desired operating characteristics as described herein.

It is to be understood that the invention is not limited to the particular materials, features, and structures specifically shown and described herein. Modifications to the illustrative embodiments will become apparent to those of ordinary skill in the art. It should also be understood that the various layers and/or regions shown in the accompanying figures are not drawn to scale, and that one or more semiconductor layers and/or regions of a type commonly used in such integrated circuits may not be explicitly shown in a given figure for ease of explanation. Particularly with respect to structure, it is to be emphasized that the descriptions provided herein are not intended to encompass all of the structural features that may be included in an FET or other switching device as may be required to form a functional integrated semiconductor device. Rather, certain features that are commonly used in forming semiconductor devices, such as, for example, spacers, and encapsulating layers, and doped regions, are purposefully not described herein for economy of description. However, one of ordinary skill in the art will readily recognize those features omitted from these generalized descriptions.

Further aspects of the present invention provide ferroelectric semiconductor switching devices and methods for operating ferroelectric semiconductor switching devices, which can be utilized in integrated circuits with various analog and digital circuitry. In particular, integrated circuit dies can be fabricated having ferroelectric semiconductor switching devices and other semiconductor devices such as a field-effect transistors, bipolar transistors, metal-oxide-semiconductor transistors, diodes, resistors, capacitors, inductors, etc., forming analog and/or digital circuits. The ferroelectric semiconductor switching devices can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device, comprising:
   a semiconductor substrate;
   a first source/drain contact and a second source/drain contact formed on the semiconductor substrate; and
   a gate structure formed on the semiconductor substrate between the first and second source/drain contacts, wherein the gate structure comprises:
   a conductive layer disposed over the semiconductor substrate;
   a ferroelectric layer disposed over the conductive layer; and
   a gate contact layer disposed over the ferroelectric layer;
   wherein the conductive layer of the gate structure is electrically connected to the first source/drain contact, and wherein the conductive layer is a non-semiconductor layer in direct contact with the first source/drain contact.

2. The device of claim 1, wherein the gate structure further comprises an insulating layer between the conductive layer and the semiconductor substrate.

3. The device of claim 1, wherein the conductive layer comprises a carbon nanostructure.

4. The device of claim 3, wherein the carbon nanostructure comprises one or more carbon nanotubes.

5. The device of claim 1, wherein the conductive layer comprises doped STO (Strontium Titanate).

6. The device of claim 1, wherein the conductive layer comprises TaN or TaSiN.

7. The device of claim 1, wherein the conductive layer comprises a transparent conducting oxide material.

8. The device of claim 1, wherein the conductive layer has a thickness of 3 nanometers or less.

9. The device of claim 1, wherein the conductive layer has a carrier density of $1\times10^{21}$ charges per cubic centimeter.

10. The device of claim 1, wherein the semiconductor substrate comprises an insulating region, wherein the first source/drain contact is formed on the insulating region of the semiconductor substrate.

11. A semiconductor device, comprising:
a semiconductor substrate;
a first source/drain contact and a second source/drain contact formed on the semiconductor substrate;
a control voltage contact;
a gate structure formed on the semiconductor substrate, wherein the gate structure comprises:
  a conductive layer disposed over the semiconductor substrate;
  a ferroelectric layer disposed over the conductive layer; and
  a gate contact layer disposed over the ferroelectric layer; and
wherein the conductive layer of the gate structure is electrically connected to the control voltage contact, and wherein the conductive layer is a non-semiconductor layer in direct contact with the control voltage contact.

12. A semiconductor device, comprising:
a semiconductor substrate;
a conductive layer formed directly on, and in contact with, the semiconductor substrate, the conductive layer formed of a non-semiconductor material having a thickness of three nanometers or less; and
a ferroelectric layer disposed over the conductive layer, wherein the ferroelectric layer has an effective negative capacitance that counteracts a capacitance provided by the conductive layer;
wherein the ferroelectric layer and the conductive layer form a gate structure of an FET device,
a contact layer disposed over the ferroelectric layer; and
a first source/drain contact and a second source/drain contact disposed on opposing sides of the gate structure, wherein the conductive layer is in direct contact with the first source/drain contact.

13. The device of claim 12, wherein the conductive layer effectively modulates current flow in the semiconductor substrate to provide a sub-threshold slope of about 50 mV/decade or less.

14. The device of claim 12, wherein the semiconductor substrate comprises an insulating layer, wherein the first source/drain contact is formed on the insulating layer.

15. The semiconductor device of claim 14, further comprising a doped region formed in the semiconductor substrate below the gate structure, wherein the conductive layer is in contact with the doped region.

16. A semiconductor integrated circuit, comprising a semiconductor substrate, and a plurality of semiconductor devices formed on the semiconductor substrate, each of the plurality of semiconductor devices comprising:
a first source/drain contact and a second source/drain contact formed on the semiconductor substrate; and
a gate structure formed on the semiconductor substrate between the first and second source/drain contacts, wherein the gate structure comprises:
  a conductive layer disposed over the semiconductor substrate;
  a ferroelectric layer disposed over the conductive layer; and
  a gate contact layer disposed over the ferroelectric layer;
wherein the conductive layer of the gate structure is electrically connected to the first source/drain contact, and wherein the conductive layer is a non-semiconductor layer in direct contact with the first source/drain contact.

17. The semiconductor integrated circuit of claim 16, wherein the gate structure further comprises an insulating layer between the conductive layer and the semiconductor substrate.

18. The semiconductor integrated circuit of claim 16, wherein the conductive layer comprises a carbon nanostructure.

19. The semiconductor integrated circuit of claim 16, wherein the conductive layer comprises doped STO (Strontium Titanate).

20. The semiconductor integrated circuit of claim 16, wherein the conductive layer comprises TaN or TaSiN.

21. The semiconductor integrated circuit of claim 16, wherein the conductive layer comprises a transparent conducting oxide material.

22. The semiconductor integrated circuit of claim 16, wherein the conductive layer has a thickness of 3 nanometers or less.

23. The semiconductor integrated circuit of claim 16, wherein the conductive layer has a carrier density of $1\times10^{21}$ charges per cubic centimeter.

* * * * *